US007147988B2

(12) United States Patent
Suzuki

(10) Patent No.: US 7,147,988 B2
(45) Date of Patent: Dec. 12, 2006

(54) PRINTING PLATE MATERIAL, ROLL OF A PRINTING PLATE MATERIAL AND PRINTING METHOD

(75) Inventor: Kazuyoshi Suzuki, Hachioji (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 0 days.

(21) Appl. No.: 11/089,270

(22) Filed: Mar. 24, 2005

(65) Prior Publication Data

US 2005/0221223 A1 Oct. 6, 2005

(30) Foreign Application Priority Data

Apr. 1, 2004 (JP) ............................. 2004-108779

(51) Int. Cl.
*G03F 7/00* (2006.01)

(52) U.S. Cl. ............................... 430/271.1; 430/272.1; 430/302; 430/309; 430/494; 101/450.1; 101/451; 101/463.1

(58) Field of Classification Search ............. 430/270.1, 430/271.1, 272.1, 302, 309, 494; 101/450.1, 101/451, 463.1
See application file for complete search history.

(56) References Cited

U.S. PATENT DOCUMENTS

| | | | | |
|---|---|---|---|---|
| 4,268,611 | A | 5/1981 | Okishi et al. | |
| 2003/0152868 | A1* | 8/2003 | Hiraoka | 430/303 |
| 2004/0033454 | A1* | 2/2004 | Ohzeki et al. | 430/619 |
| 2005/0011384 | A1* | 1/2005 | Sampei | 101/483 |
| 2005/0058942 | A1* | 3/2005 | Maehashi | 430/300 |
| 2005/0112493 | A1* | 5/2005 | Shimomura et al. | 430/211 |

FOREIGN PATENT DOCUMENTS

| | | |
|---|---|---|
| EP | 0 710 888 A2 | 5/1996 |
| EP | 1 334 841 A3 * | 8/2004 |
| JP | 11091256 | 9/1997 |
| JP | 2000275851 | 3/1999 |
| WO | WO 03/079114 A1 | 9/2003 |

* cited by examiner

*Primary Examiner*—Barbara L. Gilliam
(74) *Attorney, Agent, or Firm*—Lucas & Mercanti, LLP

(57) ABSTRACT

A printing plate material including: a plastic support; a hydrophilic layer on the plastic support; and a back layer on the plastic support, being provided on the opposite side to the hydrophilic layer, wherein the back layer includes a matting agent, and a distribution width of a projection amount of the matting agent is 1 to 20%.

5 Claims, 1 Drawing Sheet

PRINTING PLATE MATERIAL, ROLL OF A PRINTING PLATE MATERIAL AND PRINTING METHOD

This application is based on Japanese Patent Application Nos. 2004-108779 filed on Apr. 1, 2004 in Japanese Patent Office, the entire content of which is hereby incorporated by reference.

TECHNICAL FIELD

The present invention relates to a planographic printing plate material which is a plastic support and printing method using this planographic printing plate material.

BACKGROUND

With the digitalization of printing data, there has been demand for CTP technology which is low in cost, easy to handle and is as suited for printing as the PS plate. There are many kinds of printing plate supports which are used in CTP, but those using a plastic film support have become known for convenience in handling and carrying the printing plate (for example see Patent Document 1).

These days, much is expected of process-free plates which do not require development processing using a special chemical. The majority of the process-free plates are the thermal type which performs image formation using infrared laser exposure. The thermal type printing plate material is largely divided into the ablation type and printing device development type, but the printing device development type is preferable in view of device cost and the like.

Furthermore, the printing plate material which is wound up in the form of a roll is favorable in view of the plate material cost, but there is the problem that the back layer of the image forming layer which is matted may become damaged and printing device development properties are reduced as print smearing is caused.

Furthermore, when the matting agents are overconcentration in a particular area of the back layer the development properties are reduced.

The present invention was conceived in view of solving this problem.

[Patent Document 1] Japanese Patent Application Laid-Open No. 2000-258899 publication

SUMMARY

The main feature of this invention is specifying the distribution width of the projection amount of the matting agent onto the back layer.

DESCRIPTION OF THE PREFERRED EMBODIMENT

Figure 1:
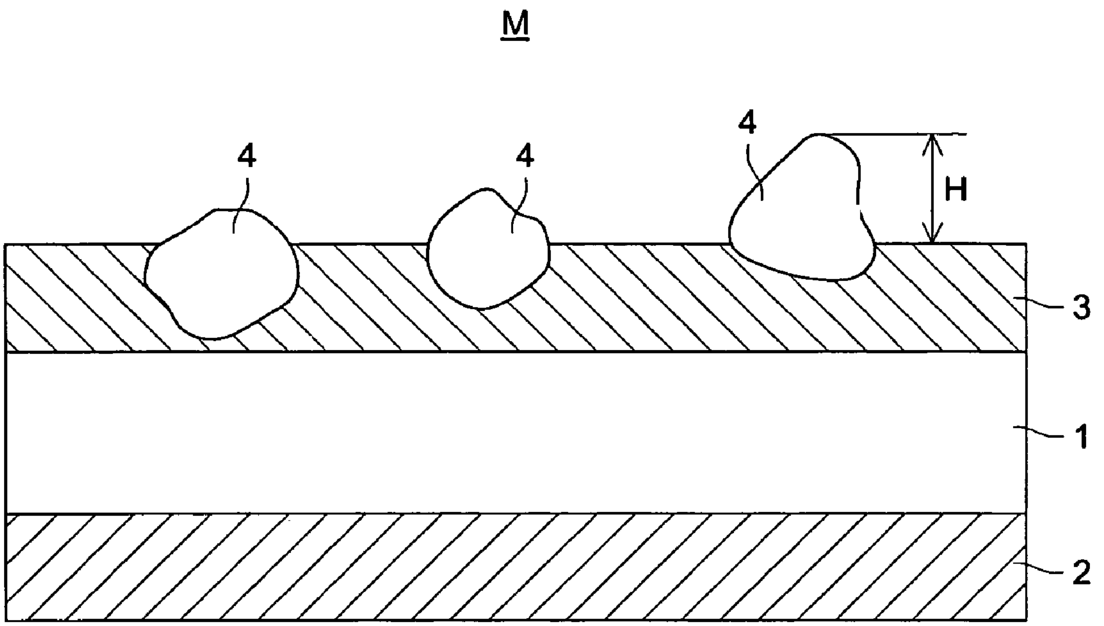
FIG. 1 is a cross-sectional drawing showing a relationship of the plastic support, a hydrophilic layer on the plastic support, and back layer including matting agents in the printing plate of the present invention.

According to this invention, printing device development properties are improved and the number of sheets of paper wasted in pre-printing preparation such as register adjustment and hue adjustment and the like is reduced, and a planographic printing plate support material which is a plastic support is provided which has back surface processing which is advantageous for register accuracy.

The object of this invention is achieved by the following configurations.

(1) A planographic printing plate material having a plastic support, wherein the planographic printing plate material is capable of printing device development, and comprises a back layer which includes a matting agent, and the width of the distribution of the projection amount of the matting agent on the back layer is 1 to 20%.

(2) The planographic printing plate material of claim 1, wherein the width of the particle distribution of the matting agent is 1 to 30%.

(3) The image recording method of (1) or (2), wherein a laser is irradiated on the planographic printing plate material and the absorbed laser is converted and images are formed.

(4) The image recording method of (3) wherein the wavelength of the laser 700 to 1500 nm.

(5) A printing method in which a hole is formed at a prescribed position on the planographic printing plate material of (1) or (2), and then the planographic printing plate material is wound onto the exposure drum and held by negative low pressure contact, and then mounted in a printing press after images are formed using laser.

(6) A roll of a printing plate material, which the printing plate material comprises:

a plastic support;

a hydrophilic layer on the plastic support; and a back layer on the plastic support, being provided on the opposite side to the hydrophilic layer, wherein the back layer includes a matting agent, and a distribution width of a projection amount of the matting agent is 1 to 20%.

(7) The printing method comprising the steps of:

imagewise exposing the printing plate material of claim 1;

providing the printing plate material on a printing device;

developing the exposed printing plate material with at least one of a dampening solution and a printing ink; and transferring the printing ink onto a recording material.

(8) The printing method of item (7), wherein the printing plate material is wound on the printing device in the providing step.

This invention is described in more detail in the following. In this invention, the binder for use in the back layer is not particularly limited. Examples thereof include polymers such as acrylic resin, polymethyl acrylate, polyvinyl butyral resin, polyurethane resin, polyamide resin, polyester resin, epoxy resin, phenol resin, polycarbonate resin, polyvinyl formal resin, shellac, gelatin, casein, agar, Arabian rubber, hydroxyethyl cellulose, cellulose acetate, cellulose acetate butylate, polyvinyl chloride, polymetacrylic acid, polyvinylidene chloride, polyvinyl acetate and the like, as well as natural resins and the like. In addition, 2 or more of these may be combined and used together. The coating amount of the back layer is in the range from 0.1 to 10 g/m$^2$ and preferably 0.5 to 8.0 g/m$^2$, and more preferably 1.0 to 7.0 g/m$^2$.

The back layer includes a matting agent. In this invention, a porous substance, a non-porous substance, organic resin particles, or inorganic fine particle may be used as the matting agent.

Examples of the inorganic matting agent include silica, alumina, zirconia, titania, carbon black, graphite, $TiO_2$, $BaSO_4$, ZnS, $MgCO_3$, $CaCO_3$, ZnO, CaO, $WS_2$, $MoS_2$, MgO, $SnO_2$, $Al_2O_3$, $\alpha$-$Fe_2O_3$, $\alpha$-FeOOH, SiC, $CeO_2$, BN, SiN, MoC, BC, WC, titan carbide, corundum, artificial diamond, garnet, garnet, quartz, rotten stone, silious earth and dolomite.

Examples of the organic matting agent include polyethylene fine particles, fluororesin particles, guanamine resin particles, acrylic resin particles, silicone resin particles, melamine resin particles, and the like.

Also particles in which a core material of organic particles such as PMMA, polystyrene and melamine are coated with inorganic particles whose core particles are smaller than the core material particles may be used as the matting agent with the inorganic coating. In this case, particle diameter of the inorganic particles is preferably 1/10 to 1/100 of that of the core particle. In addition, known metallic oxide particles such as silica, alumina, titania, zirconia may be similarly used as the inorganic particles. Various known methods may be used as the coating method for forming the inorganic coating matting agent. For example, a dry coating method is preferable in which airborne core particles and coating particles are caused to collide at high speed such as in a hybridizer for example, and the coating material particles are caused to penetrate the core particle outer surface and be fixed.

The average particle size of the matting agent is 1.0 to 10 μm, and preferably 3.0 to 9 μm. Particle diameter herein refers to the diameter when a projected image of the particle is converted to a circular image having the same area. The average particle diameter is defined as the particle diameter where the product $n \times d^3$ is a maximum for particles having a diameter d and frequency n.

In this invention, the width of the distribution of the projection amount for the back surface of the matting agent is 1 to 20% but is preferably 15% or less. If the projection amount exceeds 20% when the printing plate material is wound into a roll, there is damage to the image forming layer and the printing device development properties are reduced. Width of distribution as used herein is defined as follows.

Width of distribution (%)=Standard deviation of projection/Average projection×100

The projection amount on the back surface of the matting agent is measured using the surface roughness meter (RST/PLUS manufactured by WYKO).

The projection amount is described in more detail in the following by FIG. 1. FIG. 1 is a cross-sectional drawing showing a relationship of the plastic support 1, a hydrophilic layer 2 on the plastic support, and back layer 3 including matting agents 4 in the printing plate M of the present invention. The other layers being necessary to compose the printing plate are omitted.

In FIG. 1, H is shown as the projection amount of the present invention.

As shown in FIG. 1, the projection amount refers to the height that the matting agent projects from the surface of the back layer.

The standard deviation is a value calculated from data measured for 100 points.

The width of the particle distribution of the matting agent is also measured by the above-described method. In this invention, width of the particle distribution of the matting agent is 1 to 30% and more preferably 20% or less.

The thickness of the plastic support used in this invention is preferably 100 to 300 μm and 150 to 200 μm is particularly preferable in view of stable conveyance properties in the printing plate formation device and ease of handling as a printing plate. Also, in the drawing process, the difference in drawing temperature for the front and the back is 5° C. or less, and preferably 3° C. or less and more preferably have equal temperatures.

The water content ratio for the support is described by the formula below.

$$D\text{ (water content ratio \%)}=(w/W)\times 100$$

In the formula, W the weight of the support at equilibrium humidity at 25° C. and in a 60% RH atmosphere, and w is the water content of said support at equilibrium humidity at 25° C. and in a 60% RH atmosphere.

The water content ratio of the support is preferably not more than 0.5 weight %, more preferably 0.01 to 0.5 weight %, and 0.01 to 0.3 weight percent is particularly preferable.

Known plastic films may be used to form the plastic support of this invention.

Examples include, polyethylene terephthalate, polyethylene naphthalate, polyimide, polyamide, polycarbonate, polysulfone, polyphenylene oxide, and cellulose esters. Polyester films such as polyethylene terephthalate and polyethylene naphthalate are particularly favorable.

The hydrophilic layer side of the support or the opposite side thereto, or alternatively both sides of the support preferably have an antistatic layer. Providing the antistatic layer between the support and the hydrophilic layer also improves the adhesion to the hydrophilic layer. A polymer layer in which the metallic oxide particles or the matting agent is dispersed may be used as antistatic layer. The material for the metallic oxide particles used in the antistatic layer include $SiO_2$, ZnO, $TiO_2$, $SnO_2$, $Al_2O_3$, $In_2O_3$, MgO, BaO, $MoO_3$, $V_2O_5$, and complex oxides thereof and/or metallic oxides in which the metallic oxides listed above further include a heteroatom. These may be used singly or may be mixed and used. Preferable metallic oxides include $SiO_2$, ZnO, $SnO_2$, $Al_2O_3$, $TiO_2$, $In_2O_3$, and MgO. The thickness of the antistatic layer is preferably 0.01 to 1 μm.

The front surface of these plastic films may be subjected to corona charging, flame treatment, plasma treatment, ultraviolet irradiation and the like in order to ensure contact with the hydrophilic layer. Furthermore, the substrate surface may be roughened mechanically by sand blasting or by brush polishing and the like. Also latex having a hydrophilic functional group or providing an undercoating using a water-soluble resin are preferable aspects of the substrate surface.

Examples of the materials used in the hydrophilic layer of the printing plate material are as follows.

Examples of the material used for forming the hydrophilic layer include an organic hydrophilic matrix obtained by cross-linking or pseudo cross-linking organic hydrophilic polymers, or an inorganic hydrophilic matrix obtained by sol-gel conversion caused by hydrolysis and condensation reaction of polyalkoxysilane, titanate, zirconate or aluminate, or metallic oxides and the like. It is particularly favorable for metallic oxide particles to be included, and examples include colloidal silica, alumina sol, titania sol, and sols of other metallic oxides.

Examples of the configuration of the metallic oxide particles include, spherical, needle-shaped, feather-shaped, or any other configuration and the average particle diameter is preferably 3 to 100 nm, and fine particles of metallic oxide compounds having different average particle diameters may be used together. In addition, the particle surface may be subjected to surface processing.

The particles of the metallic oxide compound may be used as a bonding agent by utilizing the film forming properties. In this case, reduction in hydrophilic properties is less than when an organic bonding agent is used, and this is suitable for use as a hydrophilic layer.

Colloidal silica is particularly favorable for use as the metallic oxide particles. Colloidal silica has the advantage of excellent film formation even under drying conditions of relatively low temperatures.

Examples of the colloidal silica which are preferably used include the necklace colloidal silica which is described hereinafter and colloidal silica with particles having an average particle diameter of 20 nm or less and it is also preferable that the colloidal silica has alkalinity as a colloidal solution.

The material forming the hydrophilic layer may include porous metallic compound particles having a diameter less than 1 μm. The porous silica or the porous alumina silicate particles or zeolite particles described below are preferably used as the porous metallic oxide particles.

The porous silica particles are generally manufactured by a wet method or a dry method. In the wet method, the porous silica oxide can be obtained by drying and crushing the gel obtained by neutralizing the aqueous silicate solution or crushing the sediment which has been neutralized and deposited. In the dry method, it is obtained by performing combustion of silicon tetrachloride with hydrogen and oxygen and depositing the silica. The porosity and diameter of these particles are controlled by adjusting the conditions for formation. Porous silica particles obtained from the gel by the wet method are particularly preferable.

The porosity of the particles is preferably such that the pore volume is more 0.5 ml/g or greater and more preferably 0.8 ml/g or greater and even more preferably 1.0 to 2.5 ml/g. The pore volume affects water retention and contact of the coating layer, and the larger the pore volume, the more favorable the water retention and smearing during printing becomes less likely. The water volume latitude also becomes wider, but if it exceeds 2.5 ml/g, the particles themselves become extremely frail and thus resistance of the coating film is reduced. Conversely, if the pore volume is less than 0.5 ml/g printing capability is sometimes insufficient.

Zeolite is crystallized aluminosilicate and is a porous substance having regular three-dimensional network mesh openings of a pore radius of 0.3 to 1 nm. The general formula in which natural and synthetic zeolite are combined is as shown in the following.

$$(M_1, M_2\ ½)_m(Al_m\ Si_n\ O_{2(m+n)})\times H_2O$$

$M_1$ and $M_2$ are exchangeable cations and $M_1$ may be $Li^+$, $Na^+$, $K^+$, $Tl^+$, $Me_4N^+$ (TMA), $Et_4N^+$ (TEA), $Pr_4N^+$ (TPA), $C_7H_{15}N^{2+}$, $C_8H_{16}N^+$ and the like, and $M_2$ may be $Ca^{2+}$, $Mg^{2+}$, $Ba^{2+}$, $Sr^{2+}$, $C_8H_{18}N_2{}^{2+}$ and the like. Furthermore, $n \geqq m$, and the value of m/n, or in other words, the ratio of Al/Si is less than 1. The higher the Al/Si ratio, the larger the number of fixed acid centers, and thus polarity is increased and the hydrophilic properties are improved. The Al/Si ratios is preferably 0.4 to 1.0 and more preferably, 0.8 to 1.0. x is an integer.

Synthetic zeolite in which the Al/Si ratio is stable and the particle distribution is relatively sharp is preferable for the zeolite fine particles, and examples include zeolite A: $Na_{12}$ $(Al_{12}Si_{12}O_{48})$-27 $H_2O$; Al/Si ratio 1.0; zeolite X: $Na_{86}$ $(Al_{86}Si_{106}O_{384})$-264 $H_2O$; Al/Si ratio 0.811, and zeolite Y: $Na_{56}$ $(Al_{56}Si_{136}O_{384})$-250 $H_2O$; Al/Si ratio 0.412.

By including porous particles with high hydrophilicity and an Al/Si ratio of 0.4 to 1.0, the hydrophilicity of the hydrophilic layer itself is greatly improved, and smearing at the time of printing become unlikely, and the water volume latitude is widened. Furthermore, there is also improvement with regard to fingerprint smearing. If the Al/Si ratio is less than 0.4, hydrophilicity is insufficient and the improvement effects of the above-mentioned properties is reduced.

The structure of the hydrophilic layer may include layered clay mineral particles. Examples of the clay minerals include kaolinite, halloysite, talc, smektite (monmorilonite, beidillite, hectorite, saponite, and the like), vermiculite, mica, chlorite, as well as hydrotalcite, layered polyketide (kanemite, makatite, ialite, magdeide, kenyaite).

The higher the electric charge density of the unit layer, the higher the polarity and the hydrophilicity also increases. The electric charge density is preferably 0.25 or greater, and more preferably 0.6 or greater. Examples of the layer minerals having this type of charge density include smektite (charge density 0.25 to 0.6 negative charge), vermiculite (charge density 0.6 to 0.9 negative charge). In particular, synthetic fluoridized mica is favorable since a stable particle size can be obtained. Of the synthetic fluoridized mica, one having expansive properties is preferable, and one which is freely expansive is more preferable.

Furthermore, the intercalation compound of the layered mineral (pillard crystals etc.) or layered minerals which have been subjected to ion exchange processing, or those subjected to surface processing (silane coupling, organic binding, complexing) may be used.

The size of the plate-like layered mineral particles is such that-the average particle diameter is less than 1 μm when included in the layer (including the case via a swelling step and a dispersion stripping step), and the average aspect ratio is preferably greater than 50. If the particle size is within the above-range, continuity in the planar direction and flexibility which are features of the thin layer particles are imparted to the coating film, and this makes cracking difficult an allows the coating film to be strong under dry conditions. Furthermore, in coating solutions that include large amounts of particulate matter, sedimentation of the particulate matter may be controlled by the viscosity effect of the layered mineral. If the particle diameter is larger than the above range, there will be unevenness in the coating film and there may sometimes be a local decrease in strength. Also, if the aspect ratio is less than the above range, the number of particles for the amount added will decrease and the viscosity will be insufficient, and the effect of controlling sedimentation of the particulate matter will be reduced.

The amount of the layered mineral particles is preferably 0.1–30 weight % of the entire layer, and more preferably 1–10%. For expandable synthetic fluoridized mica or smektite in particular, the effect is achieved by adding a small amount. The layered mineral particles may be added to the coating solution as a powder, but because a favorable dispersion can be obtained using a simple method for preparing a liquid (one in which a dispersion step is unnecessary such as media dispersion), it is preferable that the layered mineral particles are expanded independently in water to prepare a gel and then added to the coating solution.

An aqueous silicate solution may also be used as another material for addition to the hydrophilic layer. Metal silicate salts such as sodium silicate, potassium silicate, lithium silicate are preferable, and it is preferable that the $SiO_2/M_2O$ ratio is selected such that the pH of the entire coating solution does not exceed 13 when the silicate salt is added thereto in view of preventing dissolution of the inorganic particles.

Furthermore, an inorganic polymer from the so-called sol-gel method which uses a metal alkoxide or an organic-inorganic hybrid polymer which may be used. The formation of the inorganic polymer from the so-called sol-gel method or the organic-inorganic hybrid polymer is described in “Application of the Sol-Gel method” (Published by Agne Shofu Publications, Author: Yoshio Sakuhana), but the known methods described in the documents cited herein may be used.

Also a water-soluble resin may be included. Examples of the water-soluble resin include polysaccharides, conjugated diene polymers such as polyethylene oxide, polypropylene oxide, polyvinyl alcohol, polyethylene glycol (PEG), polyvinyl ether, styrene-butadiene copolymer, methyl metacrylate-butadiene copolymer, and resins such as acrylic polymer latex, vinyl polymer latex, polyacrylic amide, polyvinyl pyrrolidone and the like, and polysaccharides may be favorably used as the water-soluble resin used in this invention.

Examples of the polysaccharide that may be used include starches, cellulose compounds, polyuron compounds, pullulan compounds and the like, but cellulose derivatives such as methyl cellulose salts, carboxy methyl cellulose salts, hydroxyl ethyl cellulose salts and the like are particularly preferable, and sodium and ammonium carboxy methyl cellulose salts are more preferable. Including polysaccharides in the hydrophilic layer has the effect of forming the surface of the hydrophilic layer in a favorable configuration.

The surface of the hydrophilic layer preferably has a concave-convex structure with a pitch of 0.1 to 20 μm like the aluminum grain of the PS plate, and water retention and preservation of the image portion is improved due to this concave-convex structure. In this type of concave-convex structure, the filler of a suitable particle size may be included in the hydrophilic layer matrix in a suitable amount, and including the aforementioned alkali colloidal silica and the aforementioned water-soluble polysaccharide in the coating solution for the hydrophilic layer causes phase separation when the hydrophilic layer is coated and dried, and thus a structure having favorable print properties is obtained, and therefore this is favorable.

The configuration of the concave-convex structure (pitch, surface roughness and the like) can be appropriately controlled by the type of alkaline colloidal solution and the amount included; the type of water-soluble polysaccharide and the amount included; the type and amount included for other additives, the solid component concentration of the coating solution, the thickness of the wet film, the drying conditions and the like.

Examples of the inorganic particles that can be included in the hydrophilic layer are known metallic oxide particles such as silica, alumina, titania, zirconia and the like, but in order to control sedimentation in the coating solution, it is favorable for porous metallic oxide particles to be used. Examples of the porous metallic oxide particles that can be favorably used are the aforementioned porous silica particles and porous aluminosilicate particles.

Examples of the particles covered with inorganic material include particles having a core of organic particles such as polymethyl metacrylate or polystyrene which are covered with inorganic particles having a diameter which is smaller than that of the core particle. It is preferable that the diameter of the inorganic particle is about 1/10 to 1/100 of that of the core particles. Examples of such inorganic particles that can be used include known metallic oxide particles such as silica, alumina, titania, zirconia and the like. The various known methods for covering can be used, but a dry coating method for coating is preferable in which airborne core particles and coating particles are caused to collide at high speed such as in a hybridizer for example, and the coating material particles are caused to penetrate the core particle outer surface and fixed.

Metal plated particles may also be used as the core of the organic particles. Examples of this type of particle include “Micropall AU” manufactured by Sekisui Chemical Industries” in which resin particles have been subjected to gold plating.

The particle diameter is not less than 1 μm and is preferably 1 to 10 μm, is more preferably 1.5 μm to 8 μm, and even more preferably 2 μm to 6 μm.

If the particle diameter exceeds 10 μm, there is the concern that the resolution in image formation will be low and there will be deterioration due to blanket smearing. The amount to be added in the case where the hydrophilic layer includes particles of a diameter greater than 1 μm is suitably adjusted to meet the image forming parameters, but is preferably 1–50 weight % of the entire hydrophilic layer, and more preferably 5–40 weight %. The entire hydrophilic layer preferably includes a low ratio of materials including carbon such as organic resins and carbon black in order to improve hydrophilicity, and it is preferable that these materials have a total not exceeding 9 weight % and more preferably, not exceeding 5 weight %.

An intermediate hydrophilic layer may be provided between the base material and the hydrophilic layer. The materials which can be used for the-intermediate hydrophilic layer are the same as those for the hydrophilic layer. However, there are few advantages for the intermediate hydrophilic layer being porous, and it is preferably imperforate in view of strength of the coating film. The amount of porous material which forms the hydrophilic matrix structure is preferably less than that used in the hydrophilic layer, and it preferable that none is included.

The amount of particles having a particle diameter no less than 1 μm that is used in the intermediate hydrophilic layer is suitably adjusted to meet the surface forming parameters of this invention, but is preferably 1–50 weight % of the total intermediate hydrophilic layer, and more preferably 5–40 weight %.

As is the case with the hydrophilic layer, intermediate hydrophilic layer also preferably includes a low ratio of materials including carbon such as organic resins and carbon black in order to improve hydrophilicity and is preferable that these materials have a total not exceeding 9 weight % and more preferably, not exceeding 5 weight %.

The hydrophilic layer, the intermediate hydrophilic layer and the other layers that are provided may include a photothermal conversion material.

The photothermal conversion material preferably uses an infrared absorbing dye, an organic/inorganic pigment, metal, or a metallic oxide, and specific examples of the materials are given below.

Examples of the infra-red absorbing dye include organic compounds such as cyanine dyes, croconium dyes, polymethine dyes, azulenium dyes, squarium dyes, thiopyrylium dyes, naphthoquinone dyes, anthraquinone dyes, organometallic complexes of phythalocyanine, naphthalocyanine, azo, thioamide, dithiole and indoaniline. More specifically, the compounds given in Japanese Patent Application Laid-Open No. 63-139191, Japanese Patent Application Laid-Open No. 64-33547, Japanese Patent Application Laid-Open No. 1-160683, Japanese Patent Application Laid-Open No. 1-280750, Japanese Patent Application Laid-Open No. 1-293342, Japanese Patent Application Laid-Open No. 2-2074, Japanese Patent Application Laid-Open No. 3-26593, Japanese Patent Application Laid-Open No.

3-30991, Japanese Patent Application Laid-Open No. 3-34891, Japanese Patent Application Laid-Open No. 3-36093, Japanese Patent Application Laid-Open No. 3-36094, Japanese Patent Application Laid-Open No. 3-36095, Japanese Patent Application Laid-Open No. 3-42281, Japanese Patent Application Laid-Open No. 3-97589, and Japanese Patent Application Laid-Open No. 3-103476. These may be used singly or may be combined and used.

Examples of the pigment include carbon, graphite, metal, metallic oxides and the like. Furnace black and acetylene black in particular are preferably used as carbon. The grain size ($d_{50}$) is preferably not greater than 100 nm, and more preferably not greater than 50 nm.

Fine particles of graphite having a diameter not greater than 0.5 μm, more preferably not greater than 100 nm, and even more preferably not greater than 50 nm can be used.

With regard to the metal, provided that the diameter of the fine particles is not greater than 0.5 μm, and more preferably not greater than 100 nm, and even more preferably not greater than 50 nm, any metal may be used. The metal may have any configuration such as spherical, flaked, needle shaped. Colloidal metal fine particles (Ag, Au and the like) are particularly favorable.

A material that shows black in the visible region or a material which is, itself, a conductor or a semi-conductor may be used as the metallic oxide. Examples of the former include $SnO_2$ (ATO) that has been doped with Sb, $In_2O_3$ (ITO) to which Sn has been added, $TiO_2$, and deoxidized TiO from $TiO_2$ (nitric oxide titan or more generally titan black). A core material ($BaSO_4$, $TiO_2$, $9Al_2O_3$-$2B_2O$, $K_2O$-$nTiO_2$ and the like) which have been covered with these metals may also be used. The particle diameter is not greater than 0.5 μm, more preferably not greater than 100 nm, and even more preferably not greater than 50 nm.

Of these photothermal conversion materials, black complex metal compounds including 2 or more types of metals are more favorable examples, and more specifically, these examples include complex metallic oxides formed from 2 or more metal selected from Al, Ti, Cr, Mn, Fe, Co, Ni, Cu, Zn, Sb, and Ba. These may be manufactured by methods disclosed in Japanese Patent Application Laid-Open No. 8-27393 publication, Japanese Patent Application Laid-Open No. 9-25126 publication, Japanese Patent Application Laid-Open No. 9-237570 publication, Japanese Patent Application Laid-Open No. 9-241529 publication, and Japanese Patent Application Laid-Open No. 10-231441.

The complex metal compound used in this invention is preferably a Cu—Cr—Mn or a Cu—Fe—Mn complex metal compound in particular. In the case of the Cu—Cr—Mn compound, the process disclosed in Japanese Patent Application Laid-Open No. 8-27393 is preferably performed in order to reduce the hexavalent chromium elution. The coloration of these complex metallic oxides with respect to the amount used, or in other words, photo-thermal conversion rate is favorable.

These complex metallic oxides preferably have an average primary particle diameter of not more than 1 μm, and an average primary particle diameter of 0.01 to 0.5 μm is more-preferable. When the average primary particle diameter is not more than 1 μm, the photo-thermal conversion capability with respect to the amount of the complex metallic oxides added is more favorable, and when the average primary particle diameter is in the range 0.01 to 0.5 μm, the photo-thermal conversion capability with respect to the amount added is even more favorable. However, photo-thermal conversion capability with respect to the amount added is greatly affected by the degree of dispersion of the particles and is favorable to the extent that dispersion is favorable. Accordingly, prior to adding these complex metallic oxide particles to the coating solution for the layer, they are preferably dispersed by a separate known method and formed into a dispersion (paste). An average primary particle diameter of less than 0.01 is not favorable because dispersion is difficult. Any dispersing agent that is suitable for dispersion may be used. The amount of the dispersing agent to be added to the complex metallic oxide particles is preferably 0.01 to 5 weight % and more favorably 0.1 to 2 weight %.

The amount of the complex metallic oxide particles to be added to the hydrophilic layer and the undercoat is 0.1 to 50 weight %, preferably 1–30 weight %, and more preferably 3–25 weight %.

The layer having the image forming function that includes the thermal melting and heat sealing fine particles may include the following materials.

The thermal melting fine particles used in this invention are particles whose viscosity when melted in a thermoplastic material in particular is low, and is formed of a material generally classified as a wax. The physical properties thereof are preferably a softening point greater than 40° C. and less than 120° C. and a melting point greater than 60° C. and less then 100° C., and more preferably, a softening point greater than 40° C. and less than 100° C. and a melting point greater than 60° C. and less than 120° C. If the melting point is less than 60° C., there is a problem with respect to shelf life, and if the melting point is greater than 300° C., ink impression sensitivity is reduced.

Examples of the materials that may be used include paraffin wax, polyolefin, polyethylene wax, microcrystalline wax, carnauba wax, candelilla wax, montan wax, fatty acid wax and the like. These materials have a molecular weight of about 800 to 10,000, and in order to facilitate emulsification these waxes are oxidized and polar groups such as a hydroxide group, ester group, carboxyl group, aldehyde group, peroxide group and the like are introduced. In addition, in order to reduce the softening point and improve operating characteristics, stearoamide, linolen amide, lauryl amide, myrister amide, hard fatty acid amide from beef, palmita amide, oleic acid amide, rice glucidic acid amide, and coconut fatty acid amide; and methylol compounds of these fatty acid amide, and methylene bis stearoamide, ethylene bis stearoamide and the like may be also be added. In addition, coumarone-indene resins, rosin denatured phenol resin, turpentine denatured phenol resin, xylene resin, ketone resin, acrylic resin, ionomer, and copolymers of these resins may be used.

Of these, any of polyethylene wax, microcrystalline wax, carnauba wax, fatty acid esters, and fatty acids may be preferably used. Because these materials have relatively low melting points and melt viscosity is low, highly sensitive image formation can be performed. Also, because these materials have lubricating ability, damage is reduced when a shearing force is applied to the surface of the printing plate material, and resistance to print smearing due to rubbing defects is improved.

Furthermore, the thermal melting particles are preferably capable of being dispersed in water, and the average particle diameter is preferably 0.01 to 10 μm and more preferably 0.1 to 3 μm. If the average particle diameter is less than 0.01 μm, when coating solution for the layer including the thermal melting fine particles is coated on the porous hydrophilic layer described hereinafter, the thermal melting particles will enter into the pores of the hydrophilic layer, or tends to enter the spaces in the minute concaves and convexes on the surface of the hydrophilic layer, and as a result, printing device development is insufficient, and causes concern with respect to greasing. If the average particle diameter of the thermal melting fine particles is larger than 10 μm, resolution will be reduced.

The composition of the thermal melting fine particles of the inside and the surface layer may change continuously or may be covered with different materials. A known microcapsule forming method or the sol-gel method may be used as the method for covering.

The amount of thermal melting fine particles to be used in the layer into which it is included is preferably 1 to 90 weight % of the entire layer, and more preferably 5 to 80 weight %.

The thermal melting fine particles which may be used in this invention include thermoplastic hydrophobic high molecular weight polymers, and softening temperature of the hydrophobic high molecular weight polymers particles has no specific upper limit, but it is preferable that the temperature is lower than the decomposition temperature of the fine particles of the high molecular weight polymer. It is also preferable that the molecular weight (Mw) of the high molecular weight polymer is in the range of 10,000 to 1,000,000.

Specific examples of the high molecular weight polymer forming the high molecular weight particles include, diene (co)polymers such as polyproplylene, polybutadiene, polyisoprene, and ethylene butadiene copolymer; synthetic rubbers such as styrene-butadiene copolymer, methylmetacrylate-butadiene copolymer, acrylonitryl-butadiene copolymer; (meta) acrylate esters such as polymethyl metacrylate, methyl metacrylate-(2-ethylhexyl-acrylate) copolymer, methyl metacrylate-metacrylic acid copolymer, methyl metacrylate-(N-Methylolacrylamide) copolymer and polyacrylonitryl; vinyl ester (co)polymers such as (meta) acrylate copolymers, polyvinyl acetate, vinyl acetate-vinyl propionate copolymer, vinyl acetate-ethylene copolymer; and vinyl acetate-(2-ethylhexylacrylate) copolymer, polyvinyl chloride, polyvinylidene chloride, polystyrene and the like and copolymers thereof. Of these, (meta) acrylate esters, (meta) acrylate (co)polymers, vinyl ester (co)polymers, polystyrene and synthetic rubbers are preferably used.

The high molecular weight polymer fine particles can be any of particles formed from high molecular weight polymers that are polymerized using any known method such as emulsification polymerization, suspension polymerization, solution polymerization, and vapor phase polymerization. Examples of methods for making the high molecular weight polymer that has been polymerized using the solution polymerization method and the vapor phase polymerization method into fine particles include a method of spraying a solution of the high molecular weight polymer dissolved in an organic solvent in an inert gas and then drying and forming into small particles, and a method of dissolving the high molecular weight polymer in an organic solvent that is immiscible with water and dispersing the resulting solution in water or in an aqueous medium, and distilling the organic solvent and forming fine particles. In addition, when polymerizing or forming fine particles of the thermal melting fine particles and the thermal sealing fine particles in either of the methods a dispersing agent and a stabilizing agent may be used as necessary. Examples include surfactants such as sodium lauryl sulfate, sodium dodecylbenzenesulfonate, polyethylene glycol or aqueous resins such as vinyl alcohol and the like. Triethyl amine, triethyl noramine and the like may also be included.

It is preferable that the thermoplastic particles can be dispersed in water, and the average particle diameter thereof is preferably 0.01 to 10 μm, and more preferably 0.1 to 3 μm. If the average diameter is less than 0.01 μm, when the coating solution for the layer including the thermal melting fine particles is coated on the porous hydrophilic layer described hereinafter, the thermal melting fine particles will enter into the pores of the hydrophilic layer, or tends to enter the spaces in the minute concaves and convexes on the surface of the hydrophilic layer, and as a result, printing device development is insufficient, and causes concern with respect to greasing. If the average particle diameter of the thermal melting fine particles is larger than 10 μm, resolution will be reduced.

The composition of the inside and the surface layer of the thermal melting fine particles may change continuously or may be covered with different materials. A known microcapsule forming method or the sol-gel method may be used as the method for covering.

The amount of thermal melting fine particles to be used in the layer into which it is included is preferably 1 to 90 weight % of the entire layer, and more preferably 5 to 80 weight %.

The image forming layer including the thermal melting and/or the thermal sealing fine particles may also include a water-soluble material. By including the water-soluble material, the removing properties are improved when removing the unexposed section of the image forming layer using the dampening solution or ink in the printing press.

The water-soluble resins given as examples of the material which can be included in the hydrophilic layer may be used as the water-soluble material here, but for the image forming layer, saccharides are preferably used, and oligosaccharides in particular are favorable.

Of the oligosaccharides, trehalose can be industrially obtained at a low cost in a comparatively high state of purity, and despite the fact that it is highly soluble in water, its hygroscopic properties are extremely low and printing device development and shelf life are extremely favorable.

If the oligosaccharide hydrate is thermally melted, and the hydrated water is removed and then hardened, anhydrous crystals will be formed (shortly after hardening), but trehalose is characterized by the fact that the hydrate has a melting point that is 100° C. higher than the anhydride. This means that immediately after it is thermally melted by infrared ray exposure and then hardened again, it is unlikely to melt at this high melting point after exposure is complete, and this has the effect of making occurrence of image defects unlikely at the time of banding exposure and the like. In order to achieve the object of this invention the oligosaccharide trelahose in particular is favorable.

The amount of oligosaccharide included in the layer of which it is composed is preferably 1 to 90 weight % of the entire layer, and more preferably 10 to 80 weight %.

Image formation on the printing plate material of this invention can be performed using heat, but it is favorable to. perform image formation by exposure using infrared lasers in particular.

More specifically, the exposure of this invention is preferably scanning exposure which uses lasers emitting in the infrared or near infrared region, or in other words, in the 700 to 1500 nm wavelength. A gas laser may be used as the laser, but it is particularly preferable to use a semiconductor laser which emits in the near infrared region.

The device suitable for scanning exposure is any type of device capable of forming images on the surface of the printing plate material based on image signal from a computer using a semiconductor laser.

Typical examples of the type of exposure include:

(1) The type in which secondary scanning is performed using a single laser beam or a plurality of laser beams on the printing plate material that is held in the flat holding mechanism and the entire surface of the printing plate material is exposed;

(2) The method in which the printing plate material which is held along the cylinder surface inside the fixed cylindrical holding mechanism is scanned in the circumferential direction of the cylinder (main scanning direction) using a single laser beam or a plurality of laser beams from inside the cylinder, and then moved to the direction perpendicular to the circumferential direction (sub-scanning direction), and the entire surface of the printing plate material is exposed; and (3) The method in which the printing plate material which is held on the surface of cylindrical drum which rotates about an axis as a rotating body, is scanned in the circumferential direction of the rotation of the drum (main scanning direction) using a single laser beam or a plurality of laser beams from outside the cylinder, and then moved to the direction perpendicular to the circumferential direction (sub-scanning direction), and the entire surface of the printing plate material is exposed.

Of the above exposure methods, the scanning exposure method described in (3) is particularly favorable, and this exposure method described in (3) is used in particular in devices for performing exposure in a printing device.

EXAMPLES

This invention is described more specifically by the following working examples, but this invention is not to be limited by these examples.

<<Creating the Support>>

PET in which the IV (Intrinsic Viscosity)=0.66 (phenol/tetrachloro ethane=6/4 (weight ratio) measured at 25° C.) is obtained by the usual methods using terephthlate and ethylene glycol. This is pelletized and then dried for 4 hours at 130° C. and then melted at 300° C. and drawn from a T-die. The resultant is then rapidly cooled on a 50° C. cooling drum and the heat-fixed film that was not drawn is subjected to hot drawing at 2 axes to thereby form the plastic support.

<<Undercoating the Support>>

One side of the plastic support obtained above is coated with the undercoat coating solution a below such that the thickness of the dry film is 0.8 μm while corona charging under conditions of 8 W/m$^2$/minute, and undercoat Coating Solution b is coated on top thereof such that the dry film has a thickness of 0.1 μm while corona charging (8 W/m$^2$/minute) (undercoat surface A). The surface of opposite side of the plastic support is coated with the undercoat Coating Solution c below such that the thickness of the dry film is 0.8 μm while corona charging under conditions of 8 W/m$^2$/minute, and undercoat Coating Solution d is coated on top thereof such that the dry film has a thickness of 1.0 μm while corona charging (8 W/m$^2$/minute) (undercoat surface B), and plastic support which has been undercoated is obtained.

<<Undercoat Coating Solution a>>

| | |
|---|---|
| 3-component copolymer latex of styrene/glycidyl metacrylate/butyl acrylate in a 60/39/1 ratio (Tg = 75° C.) | 6.3 weight % (based on solid content) |
| 3-component copolymer latex of styrene/glycidyl metacrylate/butyl acrylate in a 20/40/40 ratio | 1.6 weight % |
| Anionic surfactant S-1 | 0.1 weight % |
| Water | 92.0 weight % |

<<Undercoat Coating Solution b>>

| | |
|---|---|
| Gelatin | 1 weight % |
| Anionic Surfactant S-1 | 0.05 weight % |
| Hardener H-1 | 0.02 weight % |
| Matting agent (silica, average particle diameter 3.5 μm) | 0.02 weight % |
| Antifungal agent F-1 | 0.01 weight % |
| Water | 98.9 weight % |

<<Undercoat coating solution c>>

| | |
|---|---|
| 3-component copolymer latex of styrene/glycidyl metacrylate/butyl acrylate in a 20/40/40 ratio | 0.4 weight % (based on solid content) |
| 4-component copolymer latex of styrene/glycidyl metacrylate/butyl acrylate/acetoacetoxy ethyl metacrylate 39/40/20/1 | 7.6 weight % |
| Anionic surfactant S-1 | 0.1 weight % |
| Water | 91.9 weight % |

<<Undercoat coating solution d>>

| | |
|---|---|
| Conductive composition of component d-11/component d-12/component d1-13 in a 66/31/1 ratio | 6.4 weight % |
| Hardener H-2 | 0.7 weight % |
| Anionic Surfactant S-1 | 0.07 weight % |
| Matting agent (silica, average particle diameter 3.5 μm) | 0.03 weight % |
| Water | 93.4 weight %; |

Component d-11 having a composition of: Anionic high polymer compound formed from a copolymer of sodium styrenesulfonate/malenic acid in a 50/50 ratio Component d-12 having a composition of: 3-component copolymer latex formed from styrene/glycidyl metacrylate/butyl acrylate in a 40/40/20 ratio Component d-13 having a composition of: high polymer activity agent formed from styrene/sodium isoprene sulfonate in an 80/20 ratio

S-1

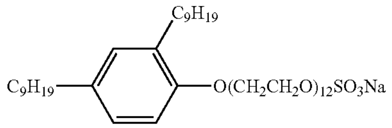

H-1

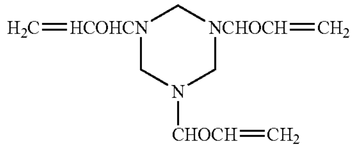

F-1

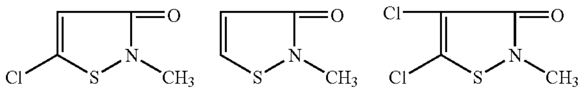

Component A Component B Component C

Component A: Component B: Component C = 50:46:4(mole ratio)

-continued

H-2

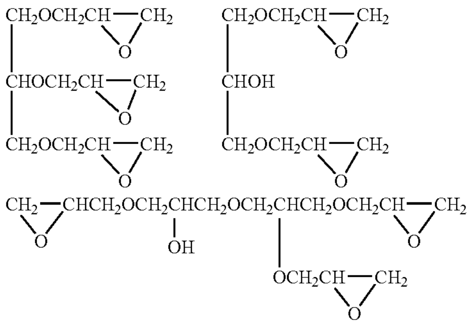

Mixture of these 3 types of compounds

<<Formation of the Planographic Printing Plate Material>>

The coating solution for the hydrophilic layer 1 shown below (method of preparation also shown below) and the coating solution for the hydrophilic layer 2 (method of preparation also shown below) are coated in that order on the undercoated support A surface using a wire bar, such the dried amount is 2.5 g/m$^2$ and 0.6 g/m$^2$ respectively and then after drying for 3 minutes at 120° C., it is subjected to heat treatment for 24 hours at 60° C. Furthermore the coating solution for image forming layer is coated such that the dried amount is 0.6 g/m$^2$ using a wire bar, and then dried for 3 minutes at 50° C. and then subjected to seasoning treatment for 72 hours at 50° C. In addition, the coating solution for each of the back surfaces is coated onto the B surface of the support that has been undercoated using a wire bar such that the distribution amount for the back surface projection is as shown in Table 1, to thereby create the planographic printing plate material.

| <<Preparation of coating solution for hydrophilic layer 1>> | |
|---|---|
| Colloidal silica (alkaline) Snotex-XS (manufactured by Nissan Chemical Industries, solid content 20 weight %) | 48 parts by weight |
| Colloidal silica (alkaline) Snotex-ZL (manufactured by Nissan Chemical Industries, solid content 40 weight %) | 4 parts by weight |
| Nissan Chemicals STM-6500S (Average particle diameter 6.5 μm, spheroid particles with a cores of melamine resin an uneven surface of silica gel) | 15 parts by weight |
| Porous metallic oxide particles Silton JC-40 (manufactured by Mizusawa Industrial Chemicals, porous alumina silicate particles, average particle diameter 4 μm) | 11.1 parts by weight |
| Water dispersed Cu—Fe—Mn based metallic oxide black pigment: TM-3550 black powder (manufactured by Dainichiseika Color & Chemicals Mfg. Co., Ltd., particle diameter: about 0.1 μm) with solid content 40 weight % (of which 2 weight % is a dispersing agent) | 20 parts by weight |
| Aqueous solution of 4 weight % of sodium carboxymethyl cellulose (manufactured by Kanto Chemicals) | 0.56 parts by weight |
| Layered mineral particles of montmorillonite mineral colloid MO (Manufactured by Southern Clay Products, average particle diameter: about 0.1 μm) is strongly agitated in a homogenizer to give a 5 weight % water-swollen gel | 1.11 parts by weight |

-continued

| | |
|---|---|
| 10 weight % aqueous solution of sodium phosphate/12 water (manufactured by Kanto Chemicals) | 0.28 parts by weight |
| <<Preparation of coating solution for hydrophilic layer 2>> | |
| Snotex-S (manufactured by Nissan Chemical Industries, solid content 30 weight %) | 30 parts by weight |
| Necklace colloidal silica (alkaline) Snotex-PSM (manufactured by Nissan Chemical Industries, solid content 20 weight %) | 45 parts by weight |
| Porous metallic oxide particles Silton JC-20 (manufactured by Mizusawa Industrial Chemicals, porous alumina silicate particles, average particle diameter 2 μm) | 10 parts by weight |
| Water dispersed Cu—Fe—Mn metallic oxide black pigments: TM-3550 black powder (manufactured by Dainichiseika Color & Chemical Mfg. Co., Ltd., particle diameter: about 0.1 μm) with solid content 40 weight % (of which 0.2 weight % is a dispersing agent) | 9 parts by weight |
| 4 weight % aqueous solution of sodium carboxymethyl cellulose (manufactured by Kanto Chemicals) | 1 part by weight |
| Layered mineral particles of montmorillonite mineral colloid MO (Manufactured by Southern Clay Products, average particle diameter: about 0.1 μm) are strongly agitated in a homogenizer to give a 5 weight % water-swollen gel | 2 parts by weight |
| 10 weight % aqueous solution of sodium phosphate/12 water (manufactured by Kanto Chemicals) | 0.5 parts by weight |
| Porous metallic oxide particles Silton AMT08 (manufactured by Mizusawa Industrial Chemicals, porous alumina silicate particles, average particle diameter 0.6 μm) | 12.5 parts by weight |
| <<Preparation of coating solution for image forming layer>> | |
| Carnauba wax emulsion A118 (Manufactured by Gifu Shellac), average particle diameter 0.3 μm, solid content 40% | 45 parts by weight |
| Microcrystalline wax A-206 (Manufactured by Gifu Shellac) | 25 parts by weight |
| 10% aqueous solution of disaccharide trehalose powder (Manufactured by Hayashi Shoji, Trehalose) | 15 parts by weight |
| 30 weight % aqueous solution of sodium polyacrylate DL-522 (manufactured by Japan Catalysts) | 10 parts by weight |
| Calcium carbonate powder (Manufactured by Maruo Calcium) | 5 parts by weight |
| <<Preparation of coating solution for the back layer>> | |
| DK-05 manufactured by Gifu Shellac | 80 parts by weight |
| Snotex-XS manufactured by Nissan Chemicals | 40 parts by weight |
| Matting agent in Table 1 | 1 part by weight |
| Water | 600 parts by weight |

The planographic printing plates 1 to 9 obtained in the manner described above were evaluated using the following method and the results are shown in Table 1.

<<Method of Evaluation>>

Lithrone 26 manufactured by Komori Corporation is used as the printing device, and after the pin of the printing press is inserted into the cut in the printing plate, coated paper (manufactured by Hoketsu, 90 kg, 720×520), a 2 weight % aqueous solution of Astromark 3 (manufactured by Nikken Chemical Laboratories) which is used as the dampening solution, and inks of 4 colors which are yellow, blue, red and black Toyo King Hi-Eco manufactured by Toyo Inks are used to perform printing with a blanket manufactured by Sumitomo-Dunlop at a printing speed of 90000 sheets/hour.

<Sheet Loss>

This is the number of sheets printed from the start of printing until when a normal print is obtained using the method described above.

<Amount of Displacement>

The plate position after printing 200 sheets is marked and used as reference and the plate position after printing 20,000 sheets subsequently and the amount of displacement between the reference position for the 200*th* sheet is visually evaluated.

TABLE 1

| | Particle Distri-bution of Matting Agent (%) | Back Surface Projection Amount Distri-bution (%) | Number of Sheets Wasted in Preprinting Preparation | Amount of Displacement From the 200th sheet to the 20,000th sheet (μm) |
|---|---|---|---|---|
| Embodiment 1 | 35 | 20 | 20 | 50 |
| Embodiment 2 | 30 | 20 | 17 | 45 |
| Embodiment 3 | 25 | 17 | 16 | 45 |
| Embodiment 4 | 20 | 13 | 15 | 35 |
| Embodiment 5 | 20 | 10 | 13 | 30 |
| Embodiment 6 | 10 | 8 | 10 | 30 |
| Embodiment 7 | 5 | 6 | 10 | 25 |
| Embodiment 8 | 5 | 3 | 8 | 20 |
| Comparative Example | 50 | 35 | 150 | 300 |

It can be seen from Table 1 that when the projection amount dstribution is out of the range in present invention the sheets wasted in preprinting preparation significantly increases, and that the number of sheets wasted in preprinting preparation is low for any of the planographic printing plate materials of this invention and register displacement does not occur.

The invention claimed is:

1. A printing plate material comprising:

a plastic support;

a hydrophilic layer on the plastic support; and a back layer on the plastic support, being provided on the opposite side to the hydrophilic layer, wherein the back layer includes a matting agent having an average particle size of 3.0 to 9 μm, and the matting agent projects from the surface of the back layer and a distribution width of a projection amount of the matting agent is 1 to 20%.

2. The printing plate material of claim 1, wherein the width of the particle distribution of the matting agent is 1 to 30%.

3. A printing method comprising the steps of:

imagewise exposing the printing plate material of claim 1;

providing the printing plate material on a printing device;

developing the exposed printing plate material with at least one of a dampening solution and a printing ink; and transferring the printing ink onto a recording material.

4. The printing method of claim 3, wherein the printing plate material is wound on the printing device in the providing step.

5. A roll of a printing plate material, which the printing plate comprises:

a plastic support;

a hydrophilic layer on the plastic support; and a back layer on the plastic support, being provided on the opposite side to the hydrophilic layer, wherein the back layer includes a matting agent having an average particle size of 3.0 to 9 μm, and the matting agent projects from the surface of the back layer and a distribution width of a projection amount of the matting agent is 1 to 20%.

* * * * *